United States Patent [19]

Hattori

[11] Patent Number: 4,821,001

[45] Date of Patent: Apr. 11, 1989

[54] CIRCUIT OSCILLATOR

[75] Inventor: Yoshio Hattori, Tokyo, Japan

[73] Assignee: Seiko Instruments Inc., Tokyo, Japan

[21] Appl. No.: 36,285

[22] Filed: Apr. 9, 1987

[30] Foreign Application Priority Data

Apr. 16, 1986 [JP] Japan ................................. 61-87642

[51] Int. Cl.⁴ .......................... H03B 5/32; H03L 1/00
[52] U.S. Cl. .................................... 331/158; 331/175; 331/177 V
[58] Field of Search ............ 331/116 R, 116 FE, 158, 331/159, 175, 177 V, 176; 357/23.5, 23.6

[56] References Cited

U.S. PATENT DOCUMENTS 4,097,829 6/1978 Cohen ......................... 331/177 V X

FOREIGN PATENT DOCUMENTS 0075211 6/1977 Japan .............................. 331/177 V
0201724 10/1985 Japan .................................... 331/158

Primary Examiner—Eugene R. LaRoche
Assistant Examiner—David Mis
Attorney, Agent, or Firm—Bruce L. Adams; Van C. Wilks

[57] ABSTRACT

A variable capacitive semiconductor element is connected to a piezo-electric resonator for controlling the oscillating frequency thereof according to the variable capacitance of the capacitive element. The variable capacitive semiconductor element comprises a floating electrode disposed on and electrically isolated from a semiconductor substrate for storing electric charge to form a capacitance region in the semiconductor substrate, a control electrode for injecting electric charge into the floating electrode to determine the amount of capacitance, and a terminal electrode for connecting the variable capacitive element to the piezo-electric resistor. A bias circuit is connected to apply a given voltage to the terminal electrode to adjust the amount of capacitance according to the given voltage.

12 Claims, 1 Drawing Sheet

CIRCUIT OSCILLATOR

BACKGROUND OF THE INVENTION

The present invention relates to an electronic circuit for oscillating a piezo-electric resonator employing a semiconductor variable capacitance element, the capacitance of which is controlled by the electric charge stored in a floating electrode covered by an insulating film and insulated from the outside. The floaing electrode is disposed on the surface of a semiconductor substrate through the insulating film.

A semiconductor variable capacitance element has heretofore been known as disclosed in a literature "Proceedings Vol. 2 in the 11th International Congress of Chronometry, edited by The French Society of Microtechnorogy and Chronometry, p. 9, 1984".

FIG. 2 is a diagram illustrating a conventional CMOS quartz oscillation circuit employing a semiconductor variable capacitance element. A feedback resistor 22 is connected between the gate and the drain of an inverter 21, and a drain resistor 23 and a quartz resonator 24 are also connected in series between the gate and the drain of the inverter 21. To both ends of the quartz resonator 24 are further connected a drain capacitor 25 and a semiconductor variable capacitance element 26 for adjusting the oscillation frequency. A voltage of a power source 28 is supplied to the inverter 21 through a constant voltage circuit or constant current circuit 27. Therefore, the quartz oscillation circuit consumes a reduced amount of electric current, and the frequency is prevented from changing that is caused by the power source voltage. The frequency is adjusted by changing the capacitance of semiconductor variable capacitance element 26 according to the electric change stored in the floating electrode of semiconductor variable capacitance element. Therefore the capacitance of semiconductor variable capacitance element 26 can be easily varied. Furthermore, the oscillation frequency can be correctly adjusted to maintain very high reliability.

In the conventional CMOS quartz oscillation circuit shown in FIG. 2, the frequency is adjusted by changing the capacitance of the semiconductor variable capacitance element 26. Change of capacitance, however, required positive and negative voltages of more than 10 volts. Furthermore, it is very difficult to change the frequency with respect to a frequency that has been previously adjusted as a reference, and, it is very difficult to correctly return the freuency that was varied to the reference frequency.

SUMMARY OF THE INVENTION

It is an object of the present invention to solve the above stated problem of the conventional structure. In order to solve the above state problems, the present invention employs, as a capacitance for adjusting the frequency, a semiconductor variable capacitance element which has a bias terminal to apply a predetermined bias voltage to a capacitor electrode of the semiconductor variable capacitance element.

DETAILED DESCRIPTION OF PREFERRED EMBODIMENT

Details of the invention will now be described with reference to embodiments.

Figure 1:
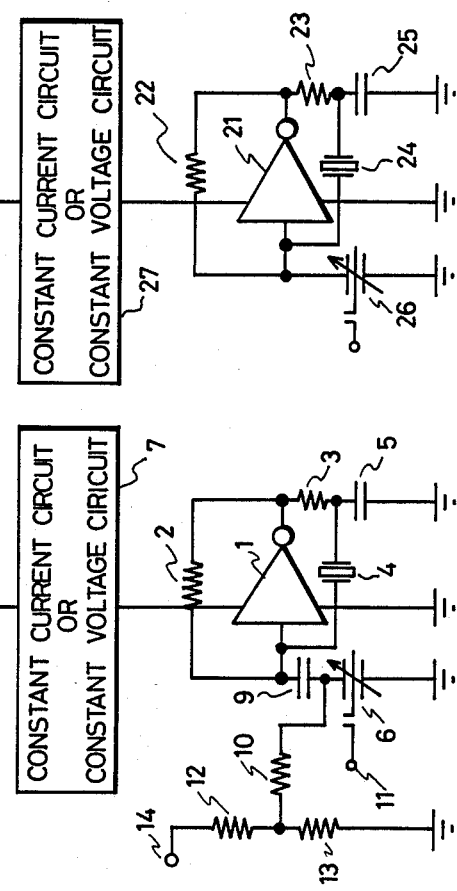
FIG. 1 is a circuit diagram illustrating a first embodiment of the present invention.

FIG. 1 is a diagram which illustrates a circuit according to a first embodiment of the present invention. A feedback resistor 2 is connected between the gate and drain of a CMOS inverter 1, and a drain resistor 3 and a quartz resonator 4 are connected in series between the gate and drain of the CMOS inverter 1. Further, a drain capacitor 5 is connected to a terminal on the drain side of quartz resonator 4, and a semiconductor variable capacitance element 6 is connected to a terminal of the gate via a DC cut capacitor 9 to adjust the oscillation frequency. A constant voltage circuit or a constant current circuit 7 is inserted between the inverter 1 and the power source 8. Therefore, the quartz oscillation circuit consumes a reduced amount of electric current, and the frequency is prevented from changing that is caused by the power source voltage. An RF cut resistor 10 is connected to the capacitor or terminal electrode of the semiconductor variable capacitance element 6, and is further connected via a dividing resistor 12 to a bias terminal 14 which receives a bias voltage from an external side. The dividing resistor R1 and R2 are provided to favorably control the change of capacitance of the semiconductor variable capacitance element by dividing the bias voltage applied to the bias terminal 14. In principle, therefore, the dividing resistors need not be provided.

The frequency is adjusted by varying the capacitance of the semiconductor variable capacitance element 6.

A variable or control electrode 11 of the semiconductor variable capacitance element 6 controls the amount of electric charge injected into and stored in the floating electrode that is disposed on in the substrate of semiconductor variable capacitance element 6. If a high voltage of either positive polarity or negative polarity is applied to the variable electrode 11, a tunnel current flows through a very thin oxide insulating film between the floating electrode and the variable electrode 11 provided in the substrate of semiconductor variable capacitance element 6, to change the amount of electric charge stored in the floating electrode. The potential of the floating electrode depends on the charge stored in the floating electrode, whereby the capacitance of the depletion layer formed on the surface of the semiconductor substrate under the floating electrode also changes. Since the floating electrode is covered by an oxide film having excellent insulating property, the amount of electric charge that is stored does not change with the lapse of the time unless a variable voltage pulse is applied to the variable 11. Therefore, the capacitance between the substrate and a capacitor electrode of the semiconductor variable capacitance element 6 can be controlled by change depending upon the amount of electric charge stored in the floating electrode.

Further, the floating electrode provided and the capacitor electrode in the substrate of semiconductor variable capacitance-element 6 are firmly capacitance coupled together, and the potential of the floating electrode is seriously affected by the voltage of the capacitor electrode. The capacitance varies depending upon the potential of the floating electrode in the semiconductor variable capacitance element 6, and, hence, the capacitance of semiconductor variable capacitance element changes with the bias voltage applied to the bias terminal 14. The voltage applied to the capacitor electrode of the semiconductor variable capacitance element 6 changes with the bias voltage applied to the bias terminal 14 and the potential of the floating electrode in the semiconductor variable capacitance element 6 changes depending upon the voltage of the capacitor electrode. Therefore, the capacitance of the semiconductor variable capacitance element 6 changes.

The frequency of the quartz oscillation circuit changes depending on the capacitance connected to the gate of the inverter 1. Therefore, the frequency of the quartz oscillation circuit of first embodiment can be changed by applying variable voltage pulses of either positive polarity or negative polarity to the variable electrode 11 or by varying the bias voltage applied to the bias terminal 14.

The absolute value of the frequency of the quartz oscillation circuit is adjusted by applying a constant bias voltage to the bias terminal 14 and by applying a variable voltage pulse to the variable electrode 11 of the semiconductor variable capacitance element 6. By applying the variable voltage pulse to the variable electrode 11 of the semiconductor variable capacitance element 6, it is made possible to very precisely control the electric charge stored in the floating electrode of the semiconductor variable capacitance element 6. Further, the electric charge once stored in the floating electrode remains very stable, and the amount of electric charge does not change for more than ten years. Moreover the amount of electric charge does not change even when the power source of the oscillation circuit is turned off.

The frequency of the quartz oscillation circuit, on the other hand, can be relatively or temporarily adjusted by changing the bias voltage applied to the bias terminal 14. The bias voltage applied to the bias terminal 14 is as small as 5 volts or less, and is easily generated by a DA converter or the like incorporated in the same IC as the quartz oscillation circuit. Furthermore, the oscillation frequency can be easily varied since it is controlled by the voltage. Two oscillation frequencies are obtained by returning the bias voltage that has been once changed to a bias voltage that serves as the reference, i.e., by forming two bias voltages and electrically switching these bias voltages. Namely, the two frequencies are easily obtained by the switching operation.

Therefore, a method of changing the bias voltage applied to the bias terminal 14 is adapted to relatively or temporarily adjust the frequency of the quartz oscillation circuit.

Figure 3:
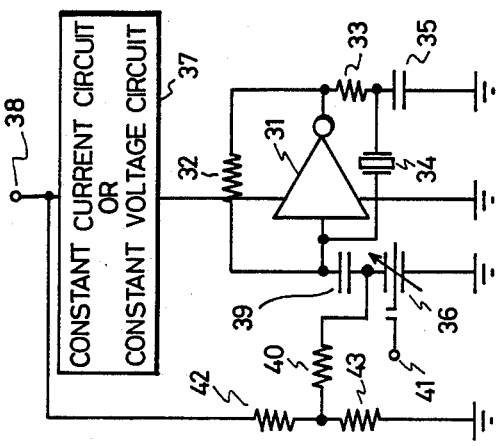
FIG. 3 is a circuit diagram illustrating a second embodiment of the present invention.
Figure 2:
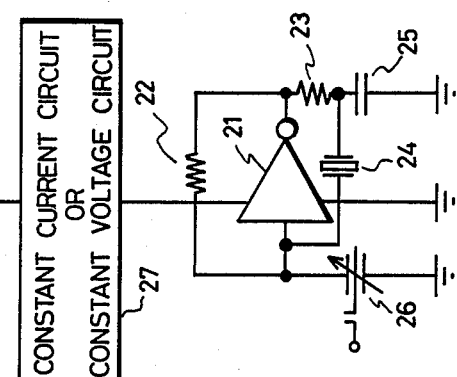
FIG. 2 is a diagram illustrating a conventional quartz oscillation circuit.

FIG. 3 is a diagram illustrating a circuit according to a second embodiment of the present invention. A feedback resistor 32 is connected between the gate and drain of a CMOS inverter 31, and a quartz resonator 34 is also connected between the gate and the drain via a drain resistor 33. Further, a drain capacitor 35 is connected to a terminal of the quartz resonator 34 at the drain side, and a semiconductor variable capacitance element 36 for adjusting the oscillation frequency is connected to the terminal of the gate side via a DC cut capacitor 39. A constant voltage circuit or constant current circuit 37 is connected between the inverter 31 and a power source 38, and the quartz oscillation circuit consumes a reduce amount of electric current. From a point where the dividing resistors 42 and 43 are connected together, a power source voltage of the quartz oscillation circuit is applied as a bias voltage to the capacitor electrode of the semiconductor variable capacitance element 36 via an RF cut resistor 40.

According to the second embodiment, the absolute value of frequency of the quartz oscillation circuit is adjusted in the same manner as in the first embodiment by maintaining the power source voltage 38 of the quartz oscillation circuit constant, and by applying a variable voltage pulse to the variable terminal 41 of the semiconductor variable capacitance element 36. Further, the bias voltage applied via the dividing resistor 42 and RF cut resistor 40 to the capacitor electrode of the semiconductor variable capacitance element 36 changes with the change in the power source voltage of the quartz oscillation circuit and, hence, the capacitance of the semiconductor variable capacitance element 36 changes. By changing the power source voltage 38 of the quartz oscillation circuit, the frequency of the quartz oscillation circuit can be changed relatively or temporarily. The sensitivity of frequency relative to the power source voltage can be adjusted by suitably selecting the resistance ratio of dividing resistors 42 and 43.

If a CMOS is employed in the oscillation circuit of the second embodiment, the electric current is consumed in very reduced amounts by the oscillation circuit. This makes it possible to connect an analog output terminal of a DA converter having a small current output capacity to the power source voltage 38 of the oscillation circuit.

According to the present invention, furthermore, the frequency can be adjusted at the normal temperature using the variable terminal 11 of the semiconductor variable capacitance element 6, and the frequency can also be easily adjusted relying upon the temperature characteristics of the quartz resonator by using the bias terminal 14.

The present invention employs, as a capacitor for adjusting frequency, a semiconductor variable capacitance element which has a bias terminal to apply a predetermined bias voltage to a capacitor electrode of the semiconductor variable capacitance element. A reference frequency that must be stored even when the power source is turned off is set by changing the amount of electric charge stored in the floating electrode of the semiconductor variable capacitance element. Further, a bias voltage applied to the capacitor electrode is varied in order to temporarily change the frequency or to relatively change the frequency. The bias voltage applied to the capacitor electrode is as low as 5 volts or less. Further, since the bias voltage has either a positive polarity or negative polarity, the power source voltage of the oscillation circuit can be used as a bias voltage. Here, the positive polarity or negative polarity of the bias voltage is determined depending on the type (p-type or n-type) of the substrate of the semiconductor variable capacitance element.

The frequency that serves as a reference can be adjusted highly precisely and highly reliably like in the conventional structure. Further, when the frequency is to be temporarily changed or is to be relatively changed without affecting the frequency that serves as the reference, the voltage necessary for controlling the frequency can be easily limited within a voltage range that is usually used for the TTL.

Further, since the bias voltage applied to the bias terminal changes with the change in the power source voltage of the oscillation circuit, the frequency of the oscillation circuit can be also changed by changing the power source voltage of the oscillation circuit.

According to the present invention, as will be obvious from the foregoing description, provision is made of a bias terminal to apply a bias voltage from the external side to the capacitor electrode of the semiconductor variable capacitance element in order to adjust the frequency of the oscillation circuit which employs a piezoelectric resonator. Therefore, the frequency can be changed not only by the amount of electric charge stored in the floating electrode of the semiconductor variable capacitance element but also by the bias voltage. Based upon these two frequency adjusting means, the absolute value of the frequency that serves as a reference can be adjusted precisely and highly reliably like in the conventional manner. Without affecting the absolute value, the frequency can be changed temporarily or relatively and very easily using a voltage that is used for an ordinary TTL.

I claim:

1. An oscillator circuit comprising: a piezo-electric resonator for oscillating at a frequency; a semiconductor variable capacitance element connected to the piezo-electric resonator for controlling the oscillating frequency thereof, the semiconductor variable capacitance element having a semiconductor substrate, an insulating film formed on the surface of the semiconductor substrate, a floaing electrode disposed on the semiconductor substrate and insulated from the outside, and a capacitor terminal electrode; means for injecting electric charge into the floating electrode to control the osillating frequency of the piezo-electric resonator; and biasing means for applying a bias voltage to the capacitor terminal electrode to control the oscillating frequency of the piezo-electric resonator.

2. An oscillator circuit as claimed in claim 1; including a DC cut capacitor connected to the capacitor terminal electrode, and a RF cut resistor connected between the capacitor terminal electrode and the biasing means.

3. An oscillator circuit as claimed in claim 1; wherein the biasing means includes a power source.

4. An oscillator circuit as claimed in claim 2; wherein the biasing means includes a power source.

5. An oscillator circuit comprising: oscillating means for producing an oscillating signal having a variable oscillating frequency; variable capacitive means having a variable capacitance and being connected to the oscillating means for controlling the oscillating frequency thereof according to the variable capacitance, the variable capacitive means comprising a semiconductor substrate, an insulating film formed on the semiconductor substrate, a floating electrode disposed on and electrically insulated from the semiconductor substrate for storing electric charge therein to thereby establish a capacitance region in the semiconductor substrate according to the amount of the stored electric charge, means including a control electrode for injecting electric charge into the floating electrode, and a terminal electrode for connecting the variable capacitive means to the oscillating means; and bias means for applying a given voltage to the terminal electrode to adjust the amount of capacitance of the capacitance region according to the given voltage.

6. An oscillator circuit as claimed in claim 5; wherein the floating electrode includes means for building up an electric potential in the floating electrode according to the stored amount of electric charge to thereby determine the amount of capacitance.

7. An oscillator circuit as claimed in claim 6; wherein the terminal electrode is formed in the semiconductor substrate and capacitively coupled to the floating electrode through the insulating film;

8. An oscillating circuit as claimed in claim 7; wherein the bias means includes means for applying a given voltage to the terminal electrode effective to adjust the electric potential of the floating electrode through the capacitive coupling between the terminal electrode and the floating electrode.

9. An oscillating circuit as claimed in claim 5; wherein the bias means includes a power source for providing a predetermined voltage, and means for applying to the terminal electrode a given voltage proportional to the predetermined voltage.

10. An oscillating circuit as claimed in claim 9; wherein the means for applying includes means for dividing the predetermined voltage by a given ratio to produce a given voltage.

11. An oscillating circuit as claimed in claim 5; including a DC cut capacitor connected between the terminal electrode and the oscillating means for cutting out DC voltage components of the voltage applied by the bias means.

12. An oscillating circuit as claimed in claim 5; including an RF cut resistor connected between the terminal electrode and the bias means for cutting out RF components of the voltage applied by the bias means.

* * * * *